(12) United States Patent
Wu et al.

(10) Patent No.: US 7,071,575 B2
(45) Date of Patent: Jul. 4, 2006

(54) SEMICONDUCTOR CHIP CAPABLE OF IMPLEMENTING WIRE BONDING OVER ACTIVE CIRCUITS

(75) Inventors: Bing-Chang Wu, Hsin-Chu Hsien (TW); Kun-Chih Wang, Hsin-Chu (TW); Mei-Ling Chao, Hsin-Chu (TW); Shiao-Shien Chen, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 38 days.

(21) Appl. No.: 10/904,431

(22) Filed: Nov. 10, 2004

(65) Prior Publication Data

US 2006/0097406 A1    May 11, 2006

(51) Int. Cl.
*H01L 23/12* (2006.01)
*H00L 23/48* (2006.01)
*H00L 29/40* (2006.01)
(52) U.S. Cl. ..................... 257/786; 257/784
(58) Field of Classification Search ............ 257/784, 257/786, 758, 780, 781
See application file for complete search history.

(56) References Cited

U.S. PATENT DOCUMENTS

| | | | | |
|---|---|---|---|---|
| 6,022,797 A | * | 2/2000 | Ogasawara et al. | 438/622 |
| 6,297,563 B1 | * | 10/2001 | Yamaha | 257/781 |
| 6,362,528 B1 | * | 3/2002 | Anand | 257/758 |
| 6,414,390 B1 | * | 7/2002 | Nozawa | 257/737 |
| 6,417,575 B1 | * | 7/2002 | Harada et al. | 257/784 |
| 6,495,918 B1 | * | 12/2002 | Brintzinger | 257/758 |
| 6,522,021 B1 | * | 2/2003 | Sakihama et al. | 257/784 |
| 6,727,590 B1 | * | 4/2004 | Izumitani et al. | 257/758 |
| 6,897,570 B1 | * | 5/2005 | Nakajima et al. | 257/786 |
| 6,900,541 B1 | * | 5/2005 | Wang et al. | 257/758 |

* cited by examiner

Primary Examiner—S. V. Clark
(74) *Attorney, Agent, or Firm*—Winston Hsu

(57) ABSTRACT

A semiconductor chip capable of implementing wire bonding over active circuits (BOAC) is provided. The semiconductor chip includes a bonding pad structure which includes a bondable metal pad, a top interconnection metal layer, a stress-buffering dielectric, and at least a first via plug between the bondable metal pad and the top interconnection metal layer. The semiconductor chip also includes at least an interconnection metal layer, at least a second via plug between the interconnection metal layer and the bonding pad structure, and an active circuit situated underneath the bonding pad structure on a semiconductor bottom.

27 Claims, 4 Drawing Sheets

SEMICONDUCTOR CHIP CAPABLE OF IMPLEMENTING WIRE BONDING OVER ACTIVE CIRCUITS

BACKGROUND OF INVENTION

1. Field of the Invention

The present invention relates to the field of semiconductor integrated circuits, and more particularly, to a semiconductor chip capable of implementing wire bonding over active circuits (also referred to as "BOAC").

2. Description of the Prior Art

Accompanying progress of the semiconductor technology, critical dimensions of integrated circuits are continually shrunk. Therefore, bonding pads which spread around on a chip are obstacles for reducing the chip size. For this reason, implementing wire bonding over active circuits is a trend for chips design and manufacturing.

FIG. 1 is a schematic cross-sectional diagram of a BOAC integrated circuit structure according to the prior art. As shown in FIG. 1, a BOAC integrated circuit structure 10 of the prior art has a plurality of active circuits on a semiconductor substrate 12. The plurality of active circuits include input/output (I/O) devices/circuits or electrostatic discharge (ESD) devices/circuits, and are made up of metal-oxide-semiconductor field-effect transistors (MOSFET) 14, 16, and 18, shallow trench isolations (STI) 20 and 22, ion diffusion regions 24, 26, 28, and 30, an inter-layer dielectric (ILD) 32, inter-metal dielectrics (IMD) 34, 36 and 38, and interconnection metal layers 40, 42, 44, 46, 48, 50, and 52. A portion of the surface of the top interconnection metal layer 52 is covered by a barrier layer 54, a protection layer 56, and a bondable metal pad 58.

According to FIG. 1, in the BOAC integrated circuit structure 10 of the prior art, the top interconnection metal layer 52 is set over the covering region of the bondable metal pad 58 and electrically links with lower active circuits formed underneath through an outside wire. Therefore, mechanical stresses press on the bondable metal pad 58 directly during bonding, and bonds between the bondable metal pad 58, the barrier layer 54, and the top interconnection metal layer 52 and the lower integrated circuits are destroyed. Moreover, the outside wire, which is formed for electrically linking the top interconnection metal layer 52 and the lower active circuits, is unfavorable for chip size shrinkage.

SUMMARY OF INVENTION

It is therefore a primary objective of the present invention to provide a BOAC integrated circuit structure which disposes at least a first via plug linking a bondable metal pad with a top interconnection metal layer and at least a second via plug linking a bonding pad structure with an interconnection metal layer beneath the bondable metal pad.

According to the objective of the present invention, a BOAC integrated circuit structure of the present invention includes a bonding pad structure. The bonding pad structure includes a bondable metal pad, a top interconnection metal layer, a stress-buffering dielectric located between the bondable metal pad and the top interconnection metal layer, and at least a first via plug disposed beneath the bondable metal pad in a stress-buffering dielectric for electrically linking the bondable metal pad with the top interconnection metal layer. Moreover, the BOAC integrated circuit structure further includes at least an interconnection metal layer, at least a second via plug disposed beneath the bonding pad structure for electrically linking the bonding pad structure with the interconnection metal layer, and an active circuit disposed beneath the bonding pad structure on a semiconductor substrate.

Since the BOAC integrated circuit structure of the present invention further includes the stress-buffering dielectric between the bondable metal pad and the top interconnection metal layer, mechanical stresses pressing on the top interconnection metal layer directly during bonding will be reduced. Additionally, the integrated circuit will not be damaged. In the present invention, since the first via plug linking the bondable metal pad with the top interconnection metal layer and the second via plug linking the bonding pad structure with the interconnection metal layer beneath the bondable metal pad are disposed beneath the bondable metal pad, the wiring area will be diminished and the chip size will be shrunk. Moreover, since the wire between the bondable metal pad and the lower active circuit of the present invention is shorter, the electric characteristics will be better.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
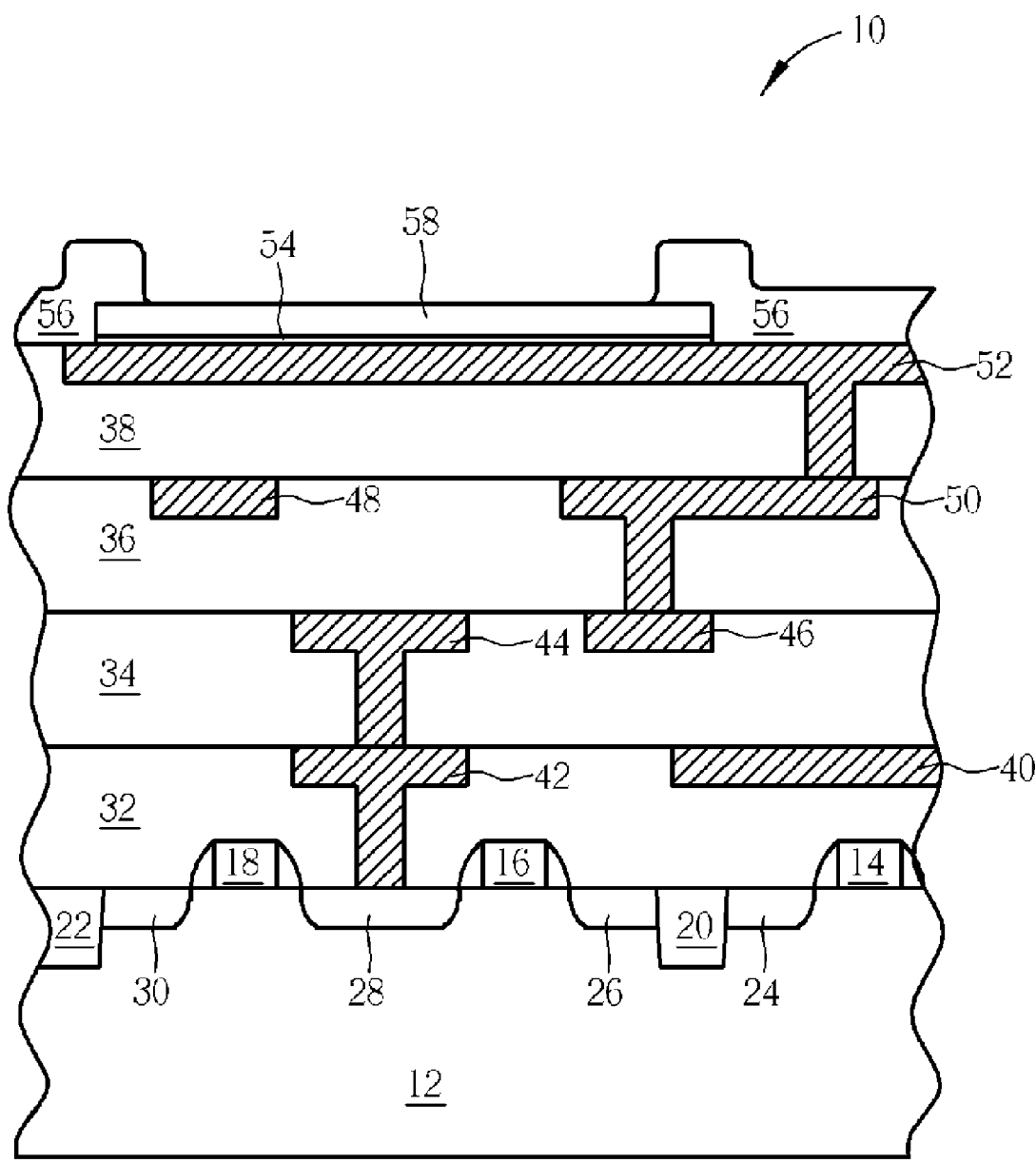
FIG. 1 is a schematic cross-sectional diagram of a BOAC integrated circuit structure according to the prior art.
Figure 2:
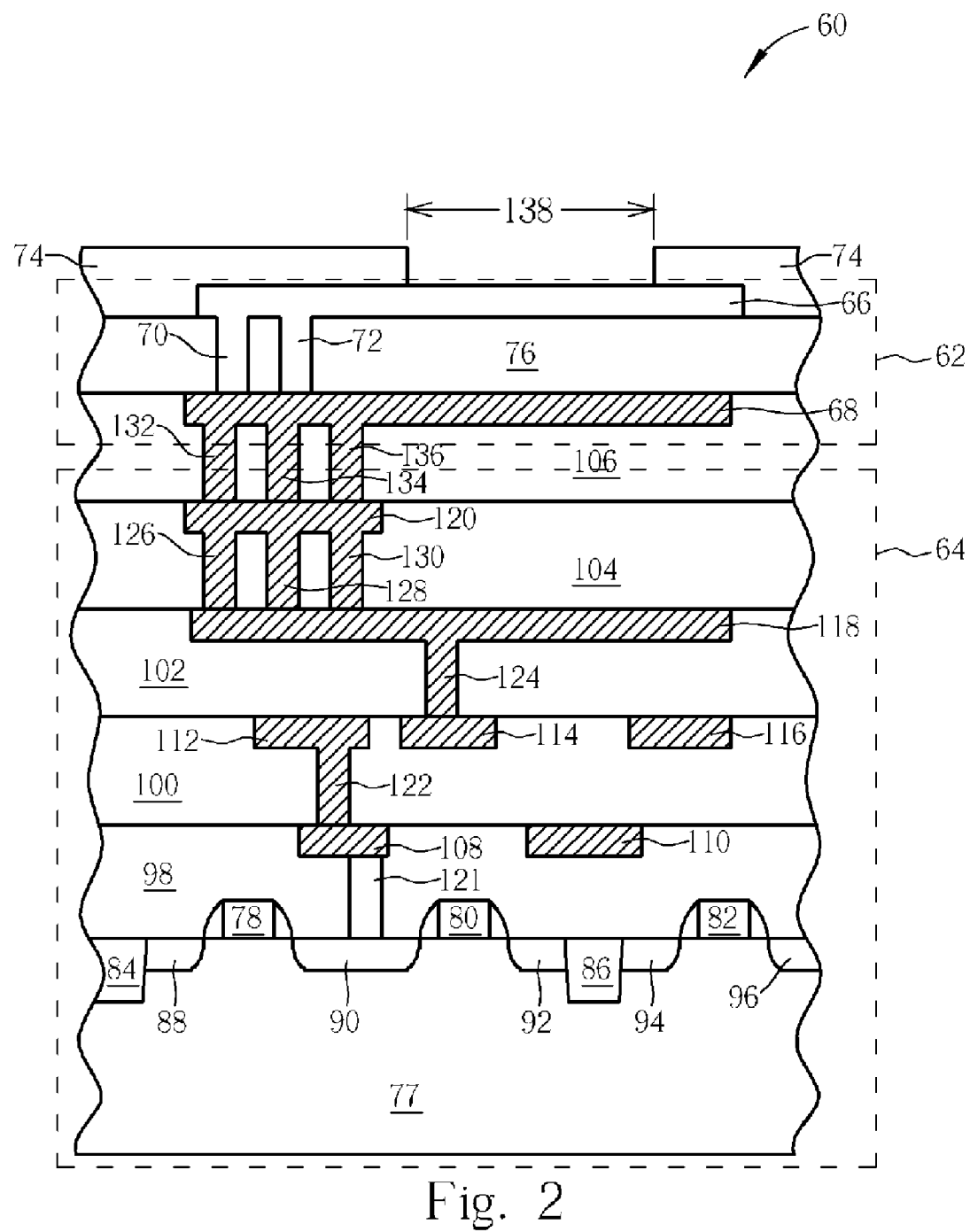
FIG. 2 is a schematic cross-sectional diagram of a BOAC integrated circuit structure according to a first embodiment of the present invention.

Please refer to FIG. 2. FIG. 2 is a schematic cross-sectional diagram of a BOAC integrated circuit structure according to a first embodiment of the present invention. As shown in FIG. 2, a BOAC integrated circuit structure 60 of the present invention includes a bonding pad structure 62 and an active circuit region 64. The bonding pad structure 62 further includes a bondable metal pad 66, a top interconnection metal layer 68, first via plugs 70 and 72 located beneath a section of the bondable metal pad 66 that is covered by a protection layer 74 and electrically linking the bondable metal pad 66 with the top interconnection metal layer 68, and a stress-buffering dielectric 76 located between the bondable metal pad 66 and the top interconnection metal layer 68.

The active circuit region 64 may include input/output (I/O) devices/circuits or electrostatic discharge (ESD) devices/circuits on a semiconductor substrate 77, and are made up of metal-oxide-semiconductor field-effect transistors (MOSFET) 78, 80, and 82, shallow trench isolations (STI) 84 and 86, ion diffusion regions 88, 90, 92, 94, and 96, an inter-layer dielectric (ILD) 98, inter-metal dielectrics (IMD) 100, 102, 104 and 106, and interconnection metal layers 108, 110, 112, 114, 116, 118, and 120. For the sake of simplicity, an integrated circuit having five levels of metal interconnections is taken as an example and is illustrated in FIG. 2. However, a person skilled in the art will appreciate that the number of metal interconnections should not be limited thereto. For example, the present invention can also be applied in integrated circuits with six, seven, or even higher levels of metal interconnections.

As shown in FIG. 2, the interconnection metal layers 108 and 110 are defined in the inter-layer dielectric 98 and electrically link with the metal-oxide-semiconductor field-effect transistors (MOSFET) 78, 80, and 82, the shallow trench isolations (STI) 84 and 86, the ion diffusion regions 88, 90, 92, 94, and 96 by a contact plug 121. The inter-layer dielectric 98 is silicon oxide (SiO2), fluoride silicate glass (FSG), or other low dielectric constant materials. According to the first embodiment of the present invention, the top interconnection metal layer 68, the interconnection metal layers 108, 110, 112, 114, 116, 118, and 120 are interconnection copper metal layers and are manufactured by a standard copper damascene process or dual damascene process.

As shown in FIG. 2, the interconnection metal layers 112, 114, and 116 are defined in the inter-metal dielectric 100 by a copper damascene process, and a via plug 122, which electrically links the interconnection metal layer 108 with the interconnection metal layer 112, and the interconnection metal layers 112 are made by a copper damascene process simultaneously in the inter-metal dielectric 100. The inter-metal dielectric 100 is formed by low dielectric constant materials or ultra-low dielectric constant materials. Here, the said ultra-low dielectric constant materials are dielectrics having a dielectric constant less than 2.5, and the structure is usually porous and fragile. The interconnection metal layers 118 is defined in the inter-metal dielectric 102 by a copper damascene process, and a via plug 124, which electrically links the interconnection metal layer 114 with the interconnection metal layer 118, is made by a copper damascene process in the inter-metal dielectric 102. The inter-metal dielectric 102 is formed by low dielectric constant materials. The interconnection metal layer 120 is defined in the inter-metal dielectric 104 by a copper damascene process, and via plugs 126, 128, and 130 which electrically link the interconnection metal layer 118 with the interconnection metal layer 120, are made by a copper damascene process in the inter-metal dielectric 104. The inter-metal dielectric 104 is formed by low dielectric constant materials. The top interconnection metal layer 68 is defined in the inter-metal dielectric 106 by a copper damascene process. A plurality of second via plugs 132, 134, and 136, located beneath a section of the bondable metal pad 66 that is covered by the protection layer 74, electrically link the top interconnection metal layer 74 with the interconnection metal layer 120 and are defined in the inter-metal dielectric 106 by a copper damascene process. The inter-metal dielectric 106 is formed by low dielectric constant materials.

The bondable metal pad 66 is covered on the stress-buffering dielectric 76, and the first via plugs 70 and 72 electrically linking the top interconnection metal layer 68 with the bondable metal pad 66 are defined in the stress-buffering dielectric 76. Since the stress-buffering dielectric 76 is made of silicon oxide or other less porous and denser dielectric materials, the stress-buffering dielectric 76 is denser than each inter-metal dielectric and is able to absorb the stress generated during bonding. As above, in the first embodiment of the present invention, the bondable metal pad 66 and the first via plugs 70 and 72 are made of aluminum and are formed by a traditional aluminum wiring process. The protection layer 74 on the top of the BOAC integrated circuit structure 60 is silicon nitride (SiN), polyimide, or other protection materials that have the same utility. The protection layer 74 further includes bonding opening exposing a portion of the top surface of the bondable metal pad 66 to form a bonding window region 138.

Figure 3:
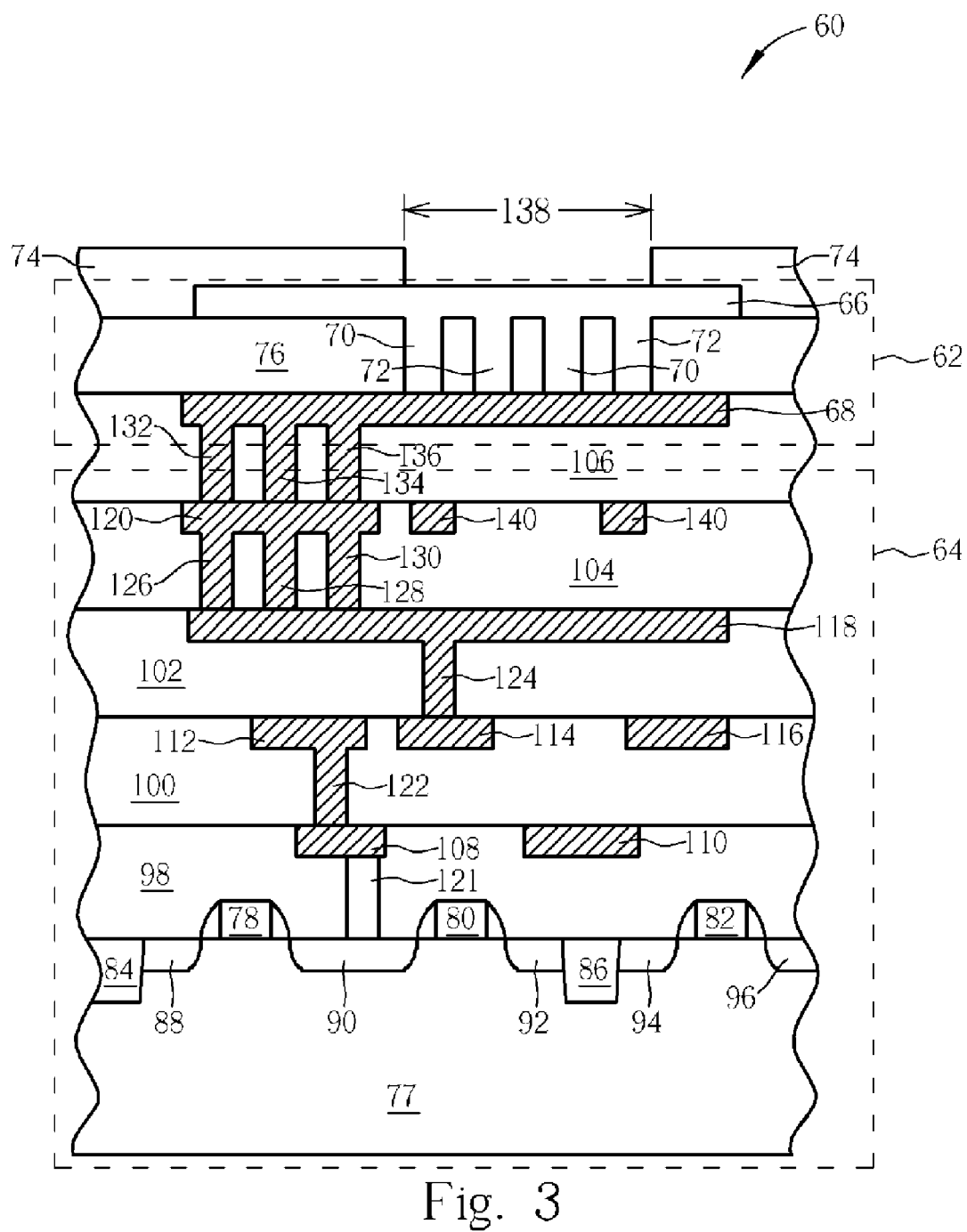
FIG. 3 is a schematic cross-sectional diagram of a BOAC integrated circuit structure according to a second embodiment of the present invention.
Figure 4:
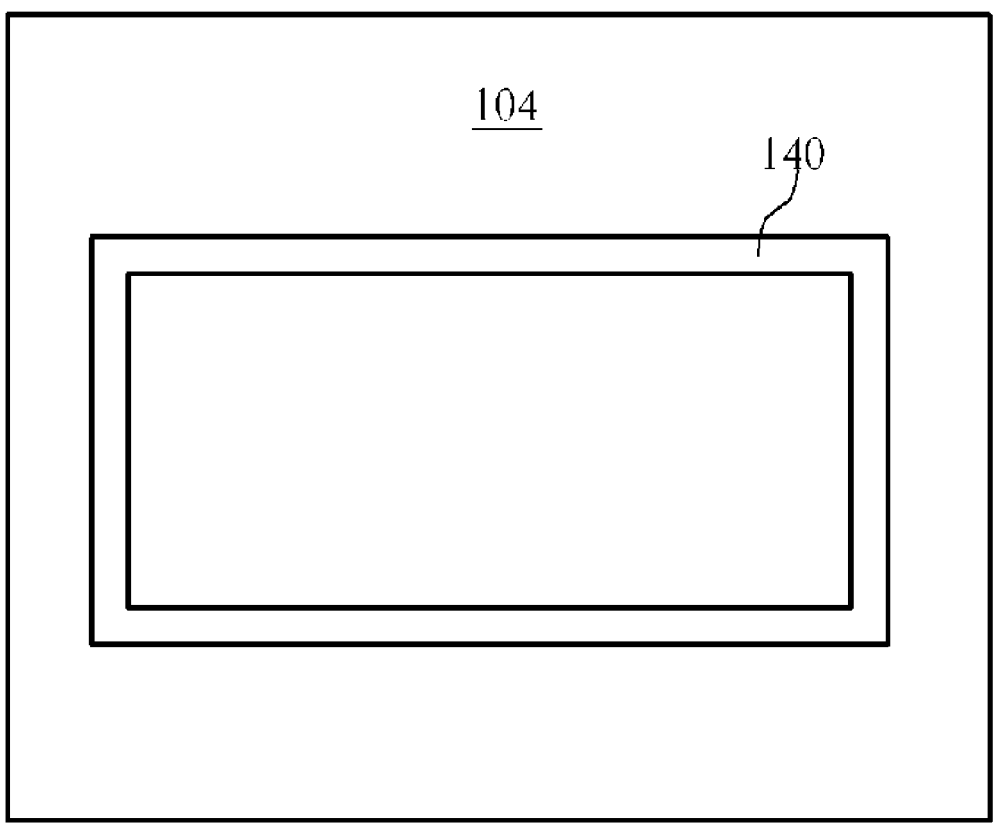
FIG. 4 is a top view of the metal frame according to the second embodiment of the present invention.

FIG. 3 is a schematic cross-sectional diagram of a BOAC integrated circuit structure according to a second embodiment of the present invention. As shown in FIG. 3, the first via plugs 70 and 72 linking the bondable metal pad 66 with the top interconnection metal layer 68 can be equally disposed beneath the bonding window region 138 in the stress-buffering layer 76 depending on the size of the bonding window region 138. Moreover, the region beneath the bonding window region 138 may further include a metal frame 140 made of copper in any inter-metal dielectric under the top interconnection metal layer 68 such as the inter-metal dielectric 104. The metal frame 140 serves as a reinforcement supporting structure. During bonding, a part of the mechanical stress exerted on the bondable metal pad 66 is absorbed by the stress-buffering dielectric layer 76 and is offset by the metal frame 140. FIG. 4 is a top view of the metal frame 140 according to the second embodiment of the present invention. As shown in FIG. 4, the metal frame 140 is located in the inter-metal dielectric 104.

In comparison with the prior art, in the present invention, since the first via plug linking the bondable metal pad with the top interconnection metal layer and the second via plug linking the bonding pad structure with the interconnection metal layer are disposed beneath the bondable metal pad, the wiring area will be diminished and the chip size will be shrunk. Moreover, since the BOAC integrated circuit structure of the present invention further includes the stress-buffering dielectric between the bondable metal pad and the top interconnection metal layer, mechanical stresses pressing on the top interconnection metal layer directly during bonding will be reduced. Additionally, the integrated circuit will not be damaged. The present further includes the metal frame serving as a reinforcement supporting structure. Since the wire between the bondable metal pad and the lower active circuit of the present invention is shorter, the electric characteristics will be better.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor chip capable of implementing wire bonding over active circuits, comprising:
    a bonding pad structure;
    at least an interconnection metal layer;
    a metal frame damascened between the bonding pad structure and the interconnection metal layer;
    at least a first via plug beneath the bonding pad structure for electrically linking the bonding pad structure and the interconnection metal layer; and
    an active circuit situated beneath the bonding pad structure and on a semiconductor substrate.

2. The semiconductor chip of claim 1, wherein the bonding pad structure comprises:
    a bondable metal pad;
    a top interconnection metal layer;
    a stress-buffering dielectric located between the bondable metal pad and the top interconnection metal layer; and
    at least a second via plug situated in the stress-buffering dielectric beneath the bondable metal pad for electrically linking the bondable metal pad and the top interconnection metal layer.

3. The semiconductor chip of claim 2 further comprising a protection layer covering the stress-buffering dielectric and a portion of the bondable metal pad.

4. The semiconductor chip of claim 3, wherein the first via plug and the second via plug both are situated beneath the bondable metal pad that is covered by the protection layer.

5. The semiconductor chip of claim 3, wherein the protection layer comprises a bonding opening exposing a portion of the top surface of the bondable metal pad to form a bonding window region.

6. The semiconductor chip of claim 5, wherein the second via plug is situated beneath the bonding window region.

7. The semiconductor chip of claim 3, wherein the protection layer is silicon nitride (SiN).

8. The semiconductor chip of claim 3, wherein the protection layer is polyimide.

9. The semiconductor chip of claim 2, wherein the stress-buffering dielectric is silicon oxide (SiO2).

10. The semiconductor chip of claim 2, wherein the bondable metal pad is an aluminum metal pad.

11. The semiconductor chip of claim 6, wherein the second via plug is an aluminum plug.

12. The semiconductor chip of claim 2 wherein the metal frame damascened in an inter-metal dielectric (IMD) beneath the top interconnection metal layer for serving as a reinforcement-supporting structure.

13. The semiconductor chip of claim 12 wherein the stress-buffering dielectric is used to absorb stresses produced while bonding, and the stresses are offset by the metal frame.

14. The semiconductor chip of claim 12 wherein the stress-buffering dielectric is denser than the inter-metal dielectric.

15. The semiconductor chip of claim 12 wherein the interconnection metal layer, the top interconnection metal layer, and the metal frame are damascened by copper.

16. An semiconductor chip capable of implementing wire bonding over active circuits comprising:
   a bondable metal pad;
   a top interconnection metal layer situated beneath the bondable metal pad;
   a stress-buffering dielectric situated between the bondable metal pad and the top interconnection metal layer;
   at least a first via plug situated in the stress-buffering dielectric beneath the bondable metal pad for electrically linking the bondable metal pad and the top interconnection metal layer;
   a protection layer covering the stress-buffering dielectric and a portion of the bondable metal pad, and comprising a bonding opening exposing a portion of the top surface of the bondable metal pad to form a bonding window region;
   at least an interconnection metal layer beneath the top interconnection metal layer;
   at least a second via plug situated beneath the bondable metal pad that is covered by the protection layer for electrically linking the top interconnection metal layer and the interconnection metal layer; and
   an active circuit situated beneath the bondable metal pad and on a semiconductor substrate.

17. The semiconductor chip of claim 16, wherein the first via plug is situated beneath the bondable metal pad that is covered by the protection layer.

18. The semiconductor chip of claim 16, wherein the first via plug is situated beneath the bonding window region.

19. The semiconductor chip of claim 16 further comprising a to plurality of first via plugs which are situated in the same interval with each other beneath the bondable metal pad.

20. The semiconductor chip of claim 16, wherein the protection layer is silicon nitride.

21. The semiconductor chip of claim 16, wherein the protection layer is polyimide.

22. The semiconductor chip of claim 16, wherein the stress-buffering dielectric is silicon oxide (SiO2).

23. The semiconductor chip of claim 16, wherein the bondable metal pad is an aluminum metal pad and the first via plug is an aluminum plug.

24. The semiconductor chip of claim 16 further comprising a metal frame damascened in an inter-metal dielectric (IMD) beneath the top interconnection metal layer for serving as a reinforcement supporting structure.

25. The semiconductor chip of claim 24, wherein the stress-buffering dielectric is used to absorb stresses produced while bonding, and the stresses are offset by the metal frame.

26. The semiconductor chip of claim 24, wherein the stress-buffering dielectric is denser than the inter-metal dielectric.

27. The semiconductor chip of claim 24, wherein the interconnection metal layer, the top interconnection metal layer, and the metal frame are damascened by copper.

* * * * *